(12) United States Patent
Morozumi et al.

(10) Patent No.: US 10,686,117 B2
(45) Date of Patent: Jun. 16, 2020

(54) PIEZOELECTRIC ELEMENT AND LIQUID EJECTION HEAD

(71) Applicant: Seiko Epson Corporation, Tokyo (JP)

(72) Inventors: Koichi Morozumi, Shiojiri (JP); Hiromu Miyazawa, Azumino (JP); Toshihiro Shimizu, Fujimi (JP); Ichiro Asaoka, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/352,921

(22) Filed: Mar. 14, 2019

(65) Prior Publication Data

US 2019/0288179 A1 Sep. 19, 2019

(30) Foreign Application Priority Data

Mar. 15, 2018 (JP) .................................. 2018-048080

(51) Int. Cl.
| | | |
|---|---|---|
| *H01L 41/187* | (2006.01) | |
| *B41J 2/14* | (2006.01) | |
| *H01L 41/083* | (2006.01) | |
| *H01L 41/08* | (2006.01) | |

(52) U.S. Cl.
CPC ...... *H01L 41/1876* (2013.01); *B41J 2/14201* (2013.01); *B41J 2/14233* (2013.01); *H01L 41/0815* (2013.01); *H01L 41/0838* (2013.01); *B41J 2002/14241* (2013.01); *B41J 2002/14258* (2013.01)

(58) Field of Classification Search
CPC ............. H01L 41/1876; H01L 41/0815; H01L 41/0838; B41J 2/14233; B41J 2/14201; B41J 2002/14258; B41J 2002/14241
See application file for complete search history.

(56) References Cited

U.S. PATENT DOCUMENTS

| | | | |
|---|---|---|---|
| 9,065,051 B2 * | 6/2015 | Morozumi | ........... B41J 2/14233 |
| 2005/0218756 A1 | 10/2005 | Fujii et al. | |
| 2011/0074890 A1 | 3/2011 | Miyazawa et al. | |
| 2011/0187237 A1 | 8/2011 | Su Enaga et al. | |
| 2015/0280103 A1 | 10/2015 | Kobayashi et al. | |
| 2017/0291419 A1 | 10/2017 | Mizukami | |

FOREIGN PATENT DOCUMENTS

| | | |
|---|---|---|
| JP | 2011-093307 A | 5/2011 |
| JP | 2011-159844 A | 8/2011 |
| JP | 2011-233817 A | 11/2011 |

OTHER PUBLICATIONS

Extended European Search Report for Patent Application No. EP 19162930.2, dated Aug. 7, 2019 (6 pages).

* cited by examiner

*Primary Examiner* — Geoffrey S Mruk
(74) *Attorney, Agent, or Firm* — Harness, Dickey & Pierce, P.L.C.

(57) ABSTRACT

A piezoelectric element includes a first electrode disposed over a substrate, an orientation control layer disposed over the first electrode and containing titanium, a piezoelectric layer disposed over the orientation control layer and having a perovskite crystal structure, and a second electrode disposed over the piezoelectric layer. The orientation control layer has a thickness in the range of 5.0 nm to 22.0 nm.

12 Claims, 13 Drawing Sheets

US 10,686,117 B2

PIEZOELECTRIC ELEMENT AND LIQUID EJECTION HEAD

This application claims priority under 35 U.S.C. § 119 to Japanese Patent Application No. 2018-048080 filed on Mar. 15, 2018, the entire disclosure of which is expressly incorporated by reference herein.

BACKGROUND

1. Technical Field

The present invention relates to a piezoelectric element and a liquid ejection head.

2. Related Art

Typically, a piezoelectric element includes a piezoelectric layer capable of electromechanical conversion, and two electrodes between which the piezoelectric element is disposed. The piezoelectric element may be used, for example, in a liquid ejection head mounted in an ink jet recording apparatus. The piezoelectric layer contains lead zirconate titanate (PZT) or any other compound, and many of the material of the piezoelectric layer have a perovskite crystal structure.

A thin piezoelectric layer has a structure in which many crystals (crystal grains) are arranged. It has been studied to increase the piezoelectric constant of individual crystals in the thin layer from the viewpoint of increasing the displacement of the piezoelectric layer. For example, in JP-A-2011-233817, lattice distortion (c/a) of the crystals in a piezoelectric body is controlled from the viewpoint of improving the piezoelectric properties and dielectric properties of the piezoelectric body.

The piezoelectric properties of a piezoelectric element vary depending on many factors, such as composition, crystal structure, crystal orientation, lattice distortion, domain structure, thickness, and structure at the interface with the electrode. Therefore, merely controlling c/a with focusing on the crystals of the piezoelectric material, as disclosed in the foregoing JP-A-2011-233817, does not sufficiently allow the piezoelectric element to exhibit a large displacement.

SUMMARY

According to an aspect of the invention, there is provided a piezoelectric element including a first electrode disposed over a substrate, an orientation control layer disposed over the first electrode and containing titanium, a piezoelectric layer disposed over the orientation control layer and having a perovskite crystal structure, and a second electrode disposed over the piezoelectric layer. The orientation control layer has a thickness in the range of 5.0 nm to 22.0 nm.

The orientation control layer may have a thickness in the range of 6.85 nm to 21.5 nm.

The piezoelectric element may further include an additional piezoelectric layer having a perovskite crystal structure between the first electrode and the orientation control layer.

The total thickness of the piezoelectric layer, the orientation control layer, and the additional piezoelectric layer may be 1.0 μm or less.

The first electrode may have a thickness in the range of 50 nm to 140 nm.

The orientation control layer may contain lead and titanium.

The second electrode may be a common electrode shared with another piezoelectric element.

According to another aspect of the invention, a liquid ejection head including the piezoelectric element described above is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments of the invention will now be described. The following embodiments will be described by way of example. The invention is not limited to the following embodiments, and various modifications may be made within the scope and spirit of the invention. All the components disclosed in the following embodiments are not necessarily required for the invention.

1. Piezoelectric Element

Figure 1:
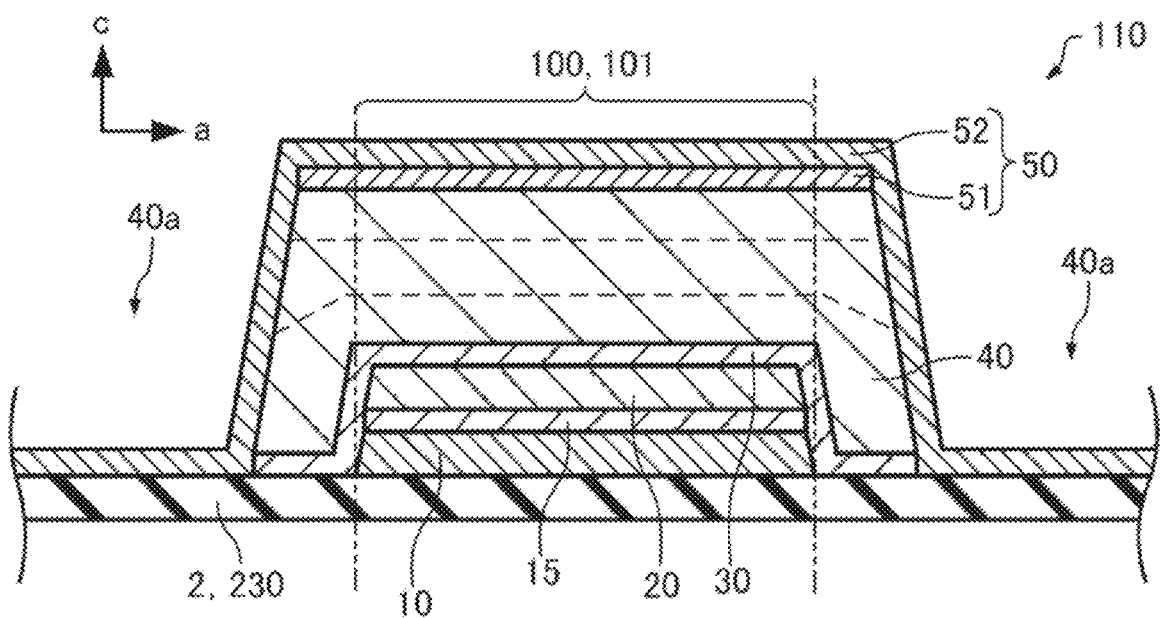
FIG. 1 is a schematic sectional view of a piezoelectric element according to an embodiment of the invention, including the definition of crystallographic axes.

A piezoelectric element disclosed herein will now be described with reference to some of the drawings. FIG. 1 is a schematic sectional view of a piezoelectric element 100 according to an embodiment of the invention. The piezoelectric element 100 includes a first electrode 10, a first orientation control layer 15, a first piezoelectric layer 20, a second orientation control layer 30, a second piezoelectric layer 40, and a second electrode 50.

1.1. First Electrode

The first electrode 10 is one of the electrodes operable to apply voltage to the first orientation control layer 15, the first piezoelectric layer 20, the second orientation control layer 30, and the second piezoelectric layer 40. The first electrode 10 may be referred to as the lower electrode. In the embodiment shown in FIG. 1, the first electrode 10 is disposed on a substrate 2 (vibration plate 230).

The first electrode 10 may be in the form of a layer. The thickness of the first electrode 10 depends on the size of the piezoelectric element 100 and, in an embodiment, may be in the range of 3 nm to 300 nm, preferably in the range of 50 nm to 140 nm. For example, in a liquid ejection head in which liquid ejection nozzles are arranged with a high density (for example, 400 dpi or more), small piezoelectric elements 100 are densely arranged. In a small piezoelectric element 100, as the thickness of the piezoelectric element 100 becomes smaller, the vibration plate is more efficiently driven. Accordingly, in an embodiment of the piezoelectric element 100, the total thickness of the first piezoelectric layer 20, the second orientation control layer 30, and the second piezoelectric layer 40 may be 1 μm or less. In this instance, the thickness of the first electrode 10 may also be reduced in the range of 10 nm to 200 nm, preferably 30 nm to 150 nm or 40 nm to 100 nm.

The first electrode 10 may contain a platinum group element. Platinum group elements are Groups 8, 9 and 10 elements in the fifth and sixth periods in the periodic table and include ruthenium, rhodium, palladium, osmium, iridium, and platinum. The first electrode 10 may have a multilayer structure including a platinum layer and an iridium layer that are formed in this order from the side opposite the first piezoelectric layer 20 (the side closer to the substrate 2). The iridium layer is a layer containing iridium as a major constituent, and the platinum layer is a layer containing platinum as a major constituent. In the description of the present disclosure, the term "major constituent" of a member or a portion implies that the content of the element of interest accounts for 80% or more (preferably 90% or more, 95% or more, or 98% or more) of the total amount of the elements in the member or portion.

The material of the first electrode 10 is not particularly limited provided that it is electrically conductive and may be a metal or an electrically conductive oxide. The first electrode 10 may be a multilayer composite defined by a plurality of layers made of such materials. A first electrode 10 including a platinum layer and an iridium layer in this order from the side opposite the first piezoelectric layer 20 (the side closer to the substrate 2) can act as a barrier, for example, to hinder more effectively one or more constituents of the first piezoelectric layer 20 from penetrating the first electrode 10 and diffusing.

In the embodiment shown in FIG. 1, the first electrode 10 is a discrete electrode separating the active portion 101 of a piezoelectric element 100 from the active portions of the other piezoelectric elements. In this instance, the active portion 101 is the overlap between the first electrode 10 and the second electrode 50 when viewed from above. In the description of the present disclosure, the portion of the piezoelectric element 100 other than the active portion 101 is referred to as the inactive portion.

1. 2. First Orientation Control Layer

The first orientation control layer 15 is disposed over the first electrode 10. In the embodiment shown in FIG. 1, the first orientation control layer 15 is disposed on the first electrode 10. Also, the first orientation control layer 15 lies between the first electrode 10 and the first piezoelectric layer 20. The first orientation control layer 15 controls the orientation of the crystals in the first piezoelectric layer 20.

The thickness of the first orientation control layer 15 may be in the range of 1.0 nm to 30.0 nm and is preferably 2.0 nm to 20.0 nm.

The first orientation control layer 15 is made of a material containing titanium. The material of the first orientation control layer 15 may be lead titanate or a solid solution made by substituting another element (for example, zirconium) for titanium or lead of lead titanate. For example, the first orientation control layer 15 may be formed by depositing a titanium layer by sputtering and firing the titanium layer simultaneously with a precursor of the first piezoelectric layer 20 when the first piezoelectric layer 20 is formed. This firing changes the titanium layer into a layer containing mainly lead titanate. The layer thus prepared may be used as the first orientation control layer 15.

1. 3. First Piezoelectric Layer

The first piezoelectric layer 20 is disposed over the first electrode layer 10. In the embodiment shown in FIG. 1, the first piezoelectric layer 20 is disposed on the first orientation control layer 15. Also, the first piezoelectric layer 20 lies between the first electrode 10 and the second orientation control layer 30.

The thickness of the first piezoelectric layer 20 may be, for example, in the range of 100 nm to 300 nm. In an embodiment of the piezoelectric element 100 that is used in a liquid ejection head in which liquid ejection nozzles are arranged with a density as high as more than 400 dpi, the first piezoelectric layer 20 may have, for example, as small a thickness as 50 nm to 200 nm. The first piezoelectric layer 20 may be deformed by applying a voltage (electric field) between the first electrode 10 and the second electrode 50. The first piezoelectric layer 20 contains crystals having a perovskite crystal structure and produces an electromechanical conversion effect when a voltage is applied thereto.

The first piezoelectric layer 20 may contain a substance having piezoelectric properties, for example a composite oxide having a perovskite crystal structure. Examples of the metal element that may be contained in the first piezoelectric layer 20 include Pb, Ba, Ca, Nb, La, Li, Sr, Bi, Na, K, Fe, Ti, Ta, Mg, Mo, Ni, Mn, Zr, Zn, W, and Yb.

Among compounds containing these metal elements, lead zirconate titanate (PZT) containing Ti, Zr, and Pb, a composite oxide (KNN) containing potassium (K), sodium (Na), and niobium (Nb), bismuth ferrate (BFO) containing Bi and Fe, or lead zirconate titanate niobate (Pb(Zr,Ti,Nb) $O_3$: PZTN) may be used. Such a composite oxide is likely to exhibit favorable piezoelectric properties.

In the embodiment shown in FIG. 1, the first piezoelectric layer 20 is formed into a shape corresponding to the shape of the first electrode 10 by patterning. Therefore, the portion of the first piezoelectric layer 20 lying under the second electrode 50 is located in the active portion 101.

The first piezoelectric layer 20 is defined by a mass of large number of crystals (crystal grains) and is composed of preferentially {100}-oriented crystals. The phrase "preferentially {100}-oriented" means that all the crystals or almost all (50% or more, preferably 80% or more or 90% or more) the crystals in the piezoelectric layer are oriented in the {100} plane. The {100} plane includes a plurality of planes equivalent to the (100) plane.

For the crystal axes of the crystals in the first orientation control layer 15, the first piezoelectric layer 20, the second orientation control layer 30, and the second piezoelectric layer 40, the c-axis extends in the direction normal to the surface of the first electrode 10 and the a-axis extends in the direction parallel to the surface of the first electrode 10, as shown in FIG. 1. In the embodiment shown in FIG. 1, the a-axis may extend in any direction rotated on the c-axis.

Since the crystals in the first piezoelectric layer 20 are oriented in the {100} plane, the piezoelectric element 100 has piezoelectric properties. The crystals in the first piezoelectric layer 20 are preferentially oriented in the {100} plane by an operation of the first orientation control layer 15.

The crystals in the first piezoelectric layer 20 each include polarized domains. A monocrystalline grain has areas having different polarization directions. A polarized domain refers to an area of such areas where the polarization directions are aligned. In general, when a piezoelectric material is crystallized (fired), many polarized domains having different spontaneous polarization directions are formed in a crystal. The polarized domains are formed depending on the process of crystal growth, presence of crystal defects, recovery from crystal defects (heat treatment), and combinations of chemical elements in the piezoelectric material, but it is not clear how the polarized domains are formed.

If a perovskite crystal structure is polarized, the crystal lattice is distorted and the crystals become tetragonal, rhombohedral, or less symmetrical than rhombohedral according to the polarization direction. Accordingly, the lattice constant of a crystal varies according to the polarization direction. Therefore, while the lattice constant of one polarized domain is constant, another polarized domain polarized in a different direction has a different lattice constant according to the polarization direction.

The first piezoelectric layer 20 disclosed herein contains densely arranged stacking defects in an area of 3 nm or less in diameter. If the domain size is reduced due to the stacking defects, domain walls become dense. Accordingly, the relative dielectric constant increases and the response to electric field is enhanced. Also, the first piezoelectric layer 20 contains a variety of ions having different charges and ionic radiuses. Different charges cause local electric fields, and different ionic radiuses produce stresses. The domains are fixed by such local electric fields or stresses. It is thought that the first piezoelectric layer thus comes into a state having no hysteresis, that is, in a state having a relative dielectric constant independent of electric field. Whether stacking defects are present in or absent from such a very small area can be checked by, for example, nano-beam electron diffraction using a transmission electron microscope, which will be described later herein.

In the first piezoelectric layer 20 of the piezoelectric element 100 disclosed herein, subdivide nano-domains are present which contain stacking defects in an area of less than 3 nm in diameter to relieve structural distortion in the crystal grain. This causes a new dielectric polarization, enhancing response to electric field and facilitating domain rotation.

1. 4. Second Orientation Control Layer

The second orientation control layer 30 is disposed over the first piezoelectric layer 20. The second orientation control layer 30 controls the orientation of the crystals in the second piezoelectric layer 40. Therefore, the second orientation control layer 30 is disposed under the second piezoelectric layer 40. The second orientation control layer 30 may be disposed in the inactive portion as well as in the active portion 101.

In the embodiment shown in FIG. 1, the second orientation control layer 30 covers the first piezoelectric layer 20, the first orientation control layer 15, the first electrode 10, and the substrate 2. In the piezoelectric element 100 disclosed herein, the structure under the second orientation control layer 30 is patterned so that the first electrode 10 can be a discrete electrode. Therefore, the surface of the first piezoelectric layer 20, the sides of the first piezoelectric layer 20, the first orientation control layer 15 and the first electrode 10, and the surface of the substrate 2 are exposed by the patterning. The second orientation control layer 30 is formed on the structure in such a state. Thus, the orientation of the second piezoelectric layer 40 over the inactive portion 40 is increased, reducing cracks in the second piezoelectric layer 40.

The second orientation control layer 30 is made of a material containing titanium. The material of the second orientation control layer 30 may be lead titanate or a solid solution made by substituting another element (for example, zirconium) for titanium or lead of lead titanate. For example, the second orientation control layer 30 may be formed by depositing a titanium layer by sputtering and firing the titanium layer simultaneously with a precursor of the second piezoelectric layer 40 when the second piezoelectric layer 40 is formed. This firing changes the titanium layer into a layer containing mainly lead titanate. The layer thus prepared may be used as the second orientation control layer 30.

The dielectric constant of the second orientation control layer 30 may be reduced depending on the material. For example, the relative dielectric constant of lead titanate is about 100 to 300 and is much lower than the relative dielectric constant (about 1500) of piezoelectric materials, such as lead zirconate titanate (PZT). Accordingly, a large part of the voltage (partial voltage) applied between the first electrode 10 and the second electrode 50 concentrates on the second orientation control layer 30 disposed between the first electrode 10 and the second electrode 50. Consequently, the voltage (partial voltage) applied to the first piezoelectric layer 20 and the second piezoelectric layer 40 is relatively reduced. This may reduce the displacement of the piezoelectric element 100 with respect to applied voltage. From such a viewpoint, it is beneficial that the material of the second orientation control layer 30 has a higher relative dielectric constant and that the second orientation control layer 30 has a smaller thickness.

Thus, by selecting a material having a higher relative dielectric constant for the second orientation control layer 30, the displacement of the piezoelectric element 100 can be increased. In addition, if the second orientation control layer 30 contains a specific material such as lead titanate, the relative dielectric constant can be adjusted by controlling distortion of the crystals of the specific material. A second orientation control layer 30 made of lead titanate allows continuous crystal growth of the underlying first piezoelectric layer 20 and the overlying second piezoelectric layer 40 that have different compositions. In other words, the first piezoelectric layer 20, the second orientation control layer 30, and the second piezoelectric layer 40 are epitaxially crystallized. Thus, the relative dielectric constant of the second orientation control layer 30 can be controlled by controlling the crystal distortion of the second orientation control layer 30.

In the piezoelectric element 100 disclosed herein, the lattice distortion (c/a) of the crystals in the second orientation control layer 30 is 0.980 to less than 1.000. Hence, the lattice of the crystals in the second orientation control layer 30 have a shape crushed in the c-axis direction (elongating in the a-axis and b-axis directions). Thus, the second orientation control layer 30 is polarized in the direction parallel to the surface of the first electrode 10 (a-axis).

According to Landolt Bornstein's Data Book, the relative dielectric constant ε of $PbTiO_3$ in a tetragonal system is the maximum (ε: about 100) in the polarization axis direction and the minimum (ε: about 200) in the direction perpendicular to the polarization axis. Therefore, by aligning the polarization axes parallel to the in-plane direction (a-axis), the orientation control layer has a lager dielectric constant, increasing the relative dielectric constant in the thickness direction compared to the case where the polarization axes are oriented in the thickness direction (c-axis) perpendicular to the in-plane direction, thus increasing the relative dielectric constant in the c-axis direction. Thus, the relative dielectric constant of the second orientation control layer 30 made of lead titanate can be increased up to about 200. Since the relative dielectric constant is thus increased in the thickness direction, the effective electric field applied to the entire PZT layer can be increased.

If the lattice distortion (c/a) of the second orientation control layer 30 is less than 0.980, the distortion of the tetragonal lattice becomes excessive, and a large energy is required for domain rotation. If domains are forcibly rotated, cracks are likely to occur. The lattice distortion has a suitable range.

Figure 5:
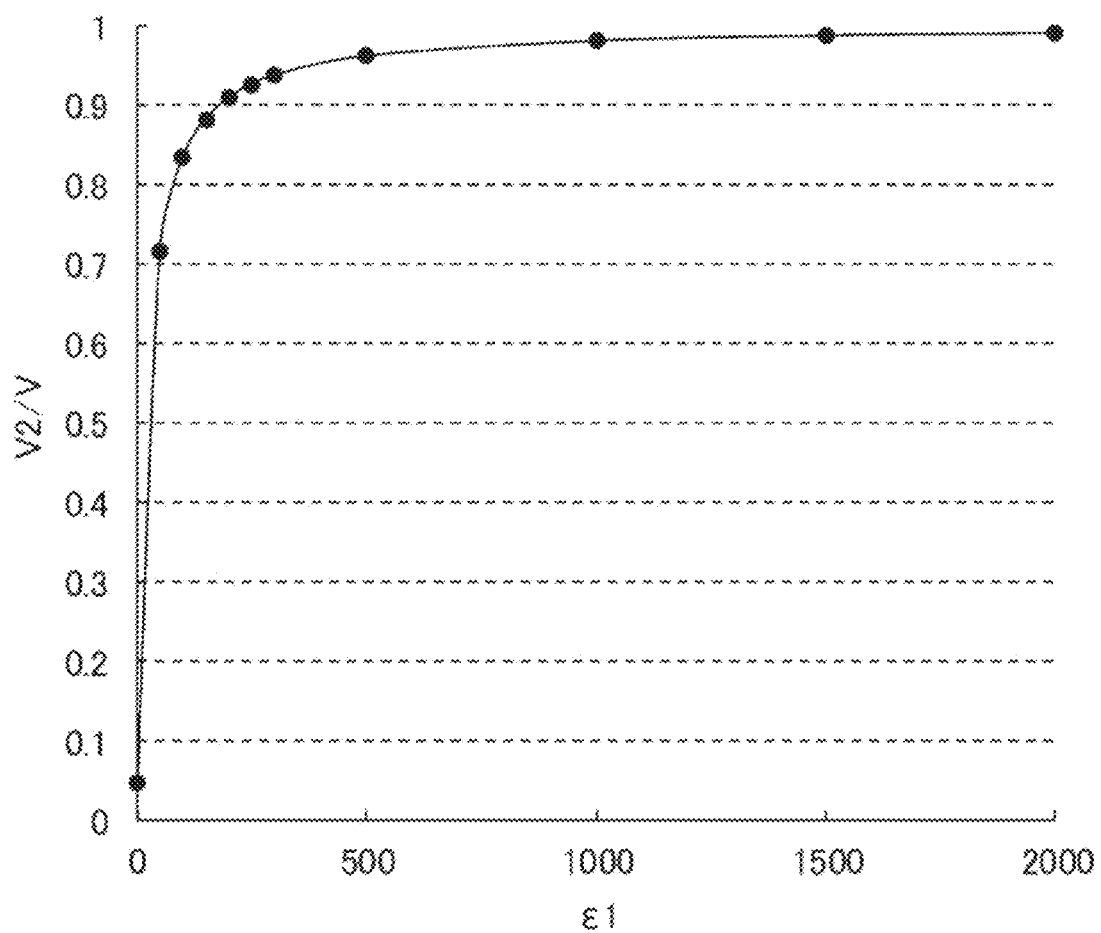
FIG. 5 is a plot of the ratio (V2/V) of the partial voltage V2 applied to a PZT layer to a voltage V applied to a multilayer composite including a low-dielectric-constant layer having a dielectric constant ε1 and the PZT layer (on the assumption that the low-dielectric-constant layer having a capacitance C1 and the PZT layer having a capacitance C2 are coupled in series, wherein the low-dielectric-constant layer has a thickness of 10 nm and the PZT layer has a relative dielectric constant ε2 of 2000 and a thickness of 760 nm).

FIG. 5 depicts a plot of the ratio (V2/V) of partial voltage V2 applied to a PZT layer to voltage V applied to a multilayer composite including a low-dielectric-constant layer having a dielectric constant ε1 and the PZT layer. As shown in FIG. 5, by increasing the dielectric constant ε1 of the low-dielectric-constant layer, the partial voltage (V2/V) applied to the PZT layer is increased and, thus, the efficiency of the displacement of the piezoelectric element can be increased.

Also, since the second orientation control layer 30 is disposed between the first electrode 10 and the second electrode 50, it is beneficial to reduce the thickness of the second orientation control layer 30 from the viewpoint of minimizing the partial voltage. However, a second orientation control layer 30 having an excessively small thickness does not function to sufficiently control the crystal orientation of the inactive portion of the second piezoelectric layer 40. The thickness of the second orientation control layer 30 has a suitable range. The suitable thickness of the second orientation control layer 30 varies depending on the material of the second orientation control layer 30, the material of the second piezoelectric layer 40, the size of the piezoelectric element 100, the distance between the first electrode 10 and the second electrode 50 (the total thickness of the first orientation control layer 15, the first piezoelectric layer 20, the second orientation control layer 30, and the second piezoelectric layer 40), and other factors.

In the piezoelectric element 100 disclosed therein, the thickness of the second orientation control layer 30 is in the range of 5.0 nm to 22.0 nm and is preferably in the range of 6.0 nm to 21.5 nm, more preferably 6.8 nm to 21.3 nm, for example, 7.0 nm to 20.0 nm or 7.0 nm to 19.0 nm. When the thickness of the second orientation control layer 30 is in such a range, domains can be 90° rotated easily and efficiently, in the direction in which voltage is applied, from the state where the polarization axes of the tetragonal crystals lean in the a-axis direction. In addition, since the energy for domain rotation is reduced, cracks are also reduced. Thus, the second orientation control layer 30 can give a distortion corresponding to the c/a ratio to the piezoelectric element 100 to increase the magnitude of displacement, as well as appropriately controlling the crystal orientation of the second piezoelectric layer 40, even though the relative dielectric constant of the second orientation control layer 30 is low. In addition, a second orientation control layer 30 having a thickness in the above range is particularly beneficial for the case where the total thickness of the first orientation control layer 15, the first piezoelectric layer 20, the second orientation control layer 30, and the second piezoelectric layer 40 is 1 μm or less.

When the second orientation control layer 30 is made of lead titanate, it may be formed by depositing a titanium layer by sputtering and firing the titanium layer simultaneously with a precursor of the second piezoelectric layer 40. In this instance, the thickness of the second orientation control layer 30 may be varied by, for example, controlling the thickness of the titanium layer. In this instance, also, a calibration curve of the relationship between the thickness of the titanium layer and the thickness of the final second orientation control layer 30 is prepared in advance, and a second orientation control layer 30 having a predetermined thickness may be formed according to the calibration curve (as in Examples).

If the second piezoelectric layer 40 is formed through a plurality of steps (as described later herein), the second orientation control layer 30 is subjected to heat cycles many times by drying, degreasing, and firing.

The thickness of the second orientation control layer 30 may be measured by, for example, using a transmission electron microscope and an optional analytical device.

1. 5. Second Piezoelectric Layer

The second piezoelectric layer 40 is disposed over the second orientation control layer 30. In the embodiment shown in FIG. 1, the second piezoelectric layer 40 is disposed on the second orientation control layer 30 and in the active portion 101 and the inactive portion of the piezoelectric element 100. In the preset disclosure, when the second piezoelectric layer 40 is called a/the piezoelectric layer, the first piezoelectric layer 20 is called additional piezoelectric layer.

The thickness of the second piezoelectric layer 40 may be, for example, in the range of 400 nm to 900 nm. In an embodiment of the piezoelectric element 100 that is used in a liquid ejection head in which liquid ejection nozzles are arranged with a density as high as more than 400 dpi, the second piezoelectric layer 40 may have a smaller thickness, for example, in the range of 300 nm to 700 nm. The second piezoelectric layer 40 may be deformed by applying a voltage (electric field) between the first electrode 10 and the second electrode 50. The second piezoelectric layer 40 contains crystals having a perovskite crystal structure and produces an electromechanical conversion effect when a voltage is applied thereto.

The second piezoelectric layer 40 may contain a substance having piezoelectric properties, for example a composite oxide having a perovskite crystal structure. Examples of the metal element that may be contained in the second piezoelectric layer 40 include Pb, Ba, Ca, Nb, La, Li, Sr, Bi, Na, K, Fe, Ti, Ta, Mg, Mo, Ni, Mn, Zr, Zn, W, and Yb.

Among compounds containing these metal elements, lead zirconate titanate (PZT) containing Ti, Zr, and Pb, a composite oxide (KNN) containing potassium (K), sodium (Na), and niobium (Nb), bismuth ferrate (BFO) containing Bi and Fe, or lead zirconate titanate niobate (Pb(Zr,Ti,Nb) $O_3$: PZTN) may be used. Such a composite oxide is likely to exhibit favorable piezoelectric properties.

Figure 2:
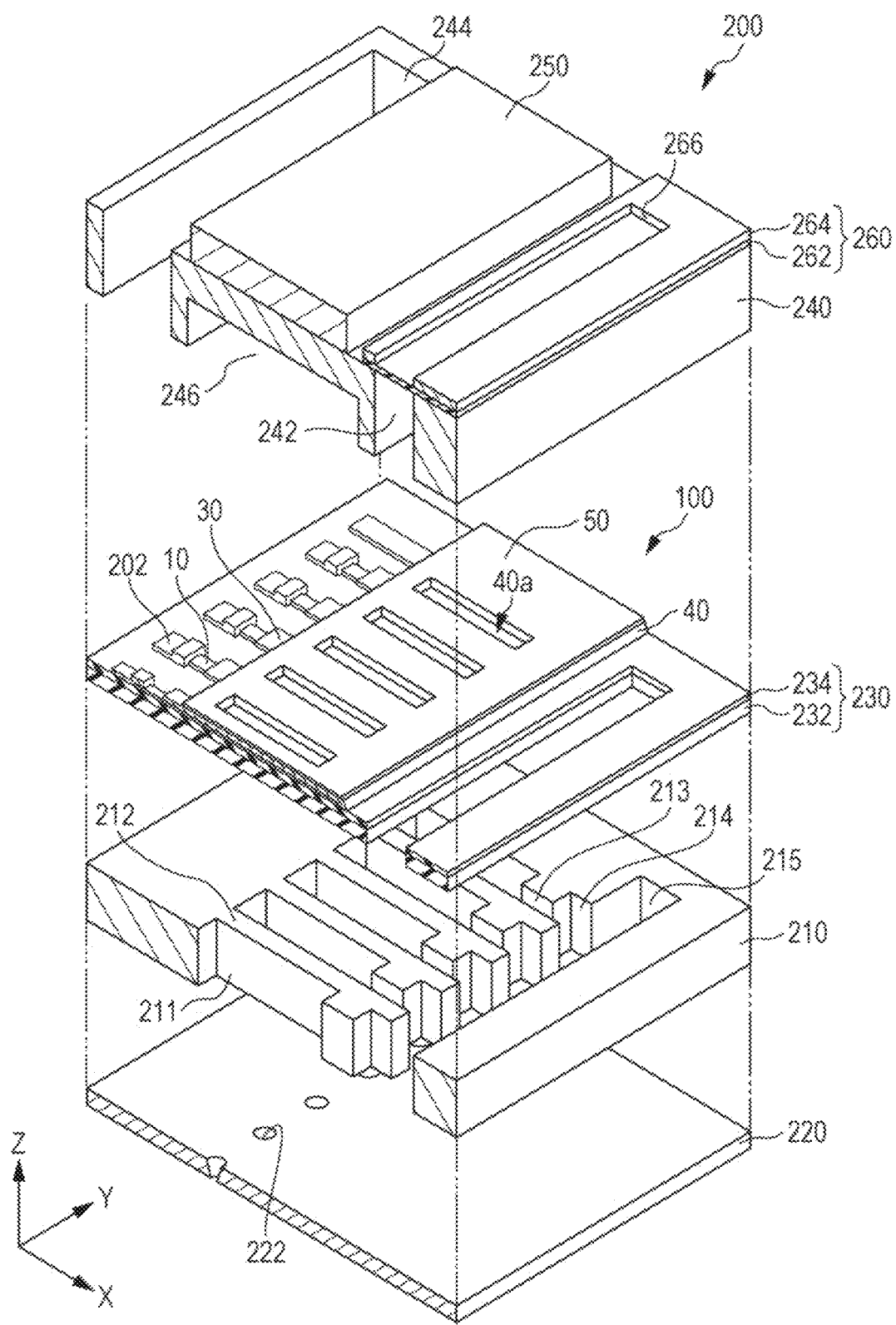
FIG. 2 is a schematic exploded perspective view of a liquid ejection head according to an embodiment of the invention.

In the embodiment shown in FIGS. 1 and 2, the second piezoelectric layer 40 is formed by patterning. The portions removed from the second piezoelectric layer 40 by patterning form recesses 40a. The active portion 101 of the piezoelectric element 100 is the overlap between the first electrode 10 and the second electrode 50. The second piezoelectric layer 40 may be formed by performing a series of some steps once or a plurality of times. The second piezoelectric layer 40 in the embodiment shown in FIG. 1 is formed through many steps. The broken lines in the second piezoelectric layer 40 shown in FIG. 1 suggest that the second piezoelectric layer 40 is formed by performing a set of steps of coating (application) and firing three times. The broken lines in the figure do not represent boundaries between portions having structural variations, and the layers divided by the broken lines form a continuous structure. Such layers may have variations in composition.

The second piezoelectric layer 40 is defined by a mass of a large number of crystals (crystal grains) as with the first piezoelectric layer 20, and the c-axes of the crystals extend substantially parallel to the normal of the first electrode 10 (in the direction toward the second electrode 50 from the first electrode 10).

The second piezoelectric layer 40 in which the crystals are preferentially oriented in the {100} plane can exhibit favorable piezoelectric properties. The presence of the above-described second orientation control layer 30 allows the crystals in the second piezoelectric layer 40 to be oriented in the [001] direction. The first piezoelectric layer 20, the second orientation control layer 30, and the second piezoelectric layer 40 are stacked and the crystals in these layers may form a continuous structure.

The crystals in the second piezoelectric layer 40 each include polarized domains as in the case of the first piezoelectric layer 20.

The domain size of the crystals in the second piezoelectric layer 40 of the piezoelectric element disclosed herein may be, but is not limited to, 10 nm or less or 5 nm or less. The reason why the polarized domain size of the crystals in the second piezoelectric layer 40 is larger than the polarized domain size of the crystals in the first piezoelectric layer 20 is that the second piezoelectric layer 40 has more favorable crystallinity than the first piezoelectric layer 20. This is because the diffusion toward the first electrode of lead by heat cycles is reduced as the layer becomes upper and the defects of lead in the A site of the perovskite skeleton can be reduced. Thus, such a second piezoelectric layer allows easy polarization rotation independent of the size of polarized domains, and pining becomes unlikely to occur.

The second piezoelectric layer 40 may be formed by, for example, a sol-gel method and may have a multilayer structure as described above. More specifically, the second piezoelectric layer 40 may be formed by repeating a set of steps including at least two of the steps of application of raw material, drying, degreasing, and firing several times.

1. 6. Second Electrode

The second electrode 50 is disposed over the second piezoelectric layer 40. The second electrode 50 includes a first layer 51 and a second layer 52. In the embodiment shown in FIG. 1, the first layer 51 of the second electrode 50 is disposed on the second piezoelectric layer 40 and is formed by patterning as in the case of the second piezoelectric layer 40. The second layer 52 of the second electrode 50 lies on the first layer 51 on the second piezoelectric layer 40 and within the recesses 40a formed by etching the second piezoelectric layer 40. The second electrode 50 is an electrode operable to apply voltage to the first orientation control layer 15, the first piezoelectric layer 20, the second orientation control layer 30, and the second piezoelectric layer 40. The second electrode 50 may be referred to as the upper electrode.

Both the first layer 51 and the second layer 52 of the second electrode 50 may be in the form of a layer. The first layer of the second electrode 51 may be, for example, in the range of 2 nm to 20 nm. The second layer of the second electrode 52 may be, for example, in the range of 5 nm to 50 nm.

The second electrode 50 may be made of a metal such as iridium, platinum, or titanium; an electrically conductive oxide of those metals, such as iridium oxide; strontium ruthenate; or any other material. The second electrode 50 may be a multilayer composite defined by some sets of the above-described layers. For example, the first layer 51 of the second electrode 50 may have a multilayer structure including an iridium layer and a titanium layer deposited in this order from the second piezoelectric layer 40 side (the side closer to the first electrode 10). Similarly, the second layer 52 of the second electrode 50 may have a multilayer structure including an iridium layer and a titanium layer deposited in this order from the second piezoelectric layer 40 side. The iridium layer is a layer containing iridium as a major constituent, and the titanium is a layer containing titanium as a major constituent. In the first layer 51, in this instance, the thickness of the iridium layer may be in the range of 3 nm to 7 nm, and the thickness of the titanium layer may be in the range of 2 nm to 6 nm. In the second layer 52, also, the thickness of the iridium layer may be in the range of 10 nm to 20 nm, and the thickness of the titanium layer may be in the range of 15 nm to 25 nm.

Such a structure of the second electrode 50, which includes the first layer 51 and the second layer 52 that form a multilayer structure including an iridium layer, a titanium layer, an iridium layer, and a titanium layer in this order on the second piezoelectric layer 40, increases the Schottky barrier at the interface with the second electrode 50 by recovery annealing after the formation of the second electrode 50, thus reducing leakage current at the interface. In addition, such a structure absorbs excess lead effectively.

1. 7. Other Members

The piezoelectric element 100 may be disposed on a substrate 2. The substrate 2 is a flat plate made of, for example, a semiconductor or an insulating material. The substrate 2 may be composed of a single layer or a plurality of layers. The substrate 2 may have any internal structure provided that the upper surface is flat. For example, the substrate 2 may a hollow plate.

The substrate 2 may be a flexible vibration plate 230 that can be deformed (displaced) by the operation of the piezoelectric element 100 or a more sophisticated structure including the vibration plate 230. The vibration plate 230 may be defined by, for example, a silicon oxide layer, a zirconium oxide layer, or a multilayer composite including such layers (for example, a multilayer composite including a silicon oxide layer and a zirconium oxide layer on the silicon oxide layer). An adhesion layer (not shown) may be disposed between the first electrode 10 and the substrate 2 so as to enhance the adhesion therebetween. The adhesion layer may be, for example, a titanium layer, a titanium oxide layer, or a zirconium layer. If the adhesion layer is an electrically conductive layer, such as a titanium layer or a zirconium layer, the electrically conductive adhesion layer may be considered to be a part of the first electrode 10.

In the present disclosure, the structure constituted of the substrate 2 (vibration plate 230) and the piezoelectric element 100 may be referred to as an actuator 110 in some cases. When the piezoelectric element 100 is deformed, the actuator 110 bends or vibrates. In a structure in which the vibration plate 230 of the actuator 110 defines a part of the wall of the pressure generating chamber of a liquid ejection head described later herein, the vibration plate 230 enables the capacity of the pressure generating chamber to vary according to the input signal.

The actuator 110 may be used, for example, as a piezoelectric actuator operable to apply a pressure to the liquid in the pressure generating chamber in a liquid ejection head or a printer or the like including the liquid ejection head. The piezoelectric element 100 may be used as a piezoelectric sensor operable to detect a deformation of the piezoelectric layer as an electrical signal (such as a supersonic sensor or a gyroscopic sensor).

1. 8 Analysis

In order to determine the axial lengths of crystals and the size of polarized domains, the lattice distortion of the crystals is accurately measured. A progression in technology of scanning transmission electron microscopes (STEM) with spherical aberration correction and peripheral devices, such as CMOS cameras, enables nano-size regions to be irradiated with a parallel electron beam. Also, a structural analysis method using section STEM-NBD (nano-beam diffraction) that enables electron diffraction patterns of very small spots synchronized with scan lines to be rapidly obtained has been established. This method enables lattice distortion at interfaces, of which the detection has been difficult, to be detected with a sensitivity of 0.1% (1/1000) or less.

For such analysis, an atomic resolution analytical electron microscope JEM-ARM200F (accelerating voltage: 200 kV, manufactured by JEOL) and ONE-VIEW STEMx camera system (manufactured by GATAN) may be used.

More specifically, for analysis of the crystals in the second orientation control layer 30, a substantially parallel electron beam of about 3 nm in diameter is emitted to impinge on a randomly selected (columnar) crystal grain in the <100> pc direction (μμDIFF mode, Cs corrector: OFF), and a thus obtained electron diffraction pattern (nano-beam diffraction (NBD) pattern) is synchronized with scan lines to yield a 4D-STEM image (150 nm in width×300 nm in height) four-dimensionally distributed in a real space and an inverse space.

For the distortion ratio (c/a) of the crystal, the distortion at each point is automatically measured with respect to a referential diffraction pattern of the interior of the crystal grain, and a distortion map image is displayed. Still more specifically, the distortion in the direction parallel to the first electrode 10 ((a-axial length/a-axial length in the referential diffraction pattern)—1: εxx) and the distortion in the direction perpendicular to the first electrode 10 ((c-axial length/c-axial length in the referential diffraction pattern)—1: εyy) may be measured. The two distortions in each direction are converted to the respective axial lengths (1+εxx, 1+εyy), and the map image of their ratio c/a is displayed. The distortion ratio (c/a) is read from the map image.

The crystallinity of each of the piezoelectric layers may also be determined from an electron diffraction pattern (nano-beam diffraction pattern). An electron diffraction pattern of a monocrystalline region reflects the crystallinity of the region defined by the spot diameter of the convergent electron beam. If the crystal of a diffraction pattern has a defect, a spot or a streak derived from the defect is observed in the diffraction pattern.

1. 9. Effects

In the piezoelectric element 100 disclosed herein, since the thickness of the second orientation control layer 30 is in the range of 5.0 nm to 22.0 nm, the displacement of the entire piezoelectric element 100 can be large even if the partial voltage applied to the second orientation control layer 30 of the voltage applied between the first electrode 10 and the second electrode 50 is high. In the piezoelectric element 100 disclosed herein, in addition, since the distortion ratio (c/a) of crystals in the second orientation control layer 30 is in the range of 0.980 to less than 1.000, the relative dielectric constant of the second orientation control layer 30 is increased, and consequently, the displacement of the entire piezoelectric element 100 can be large even if the partial voltage applied to the second orientation control layer 30 of the voltage applied between the first electrode 10 and the second electrode 50 is high. Furthermore, in the first piezoelectric layer 20 of the piezoelectric element 100, since the domains are subdivided by stacking defects in an area having a diameter of 3 nm or less, it is thought that the response to electric field of the first piezoelectric layer is enhanced. Since domains can be rotated in a low electric field, the first piezoelectric layer 20 is unlikely to crack.

2. Method for Manufacturing the Piezoelectric Element

A method for manufacturing the piezoelectric element 100 disclosed herein will now be described.

First, a substrate 2 is prepared. More specifically, a {110} silicon substrate is oxidized by heating to yield a 520 nm-thick silicon oxide layer. Subsequently, a zirconium layer is deposited on the silicon oxide layer by sputtering, and the zirconium layer is oxidized by heating to yield a 200 nm-thick zirconium oxide layer. Thus, the substrate 2 is prepared through those steps.

Next, a 20 nm-thick titanium layer is formed as an adhesion layer on the substrate 2, and a first electrode 10 is formed by forming a 50 nm-thick platinum layer and a 5 nm-thick iridium layer in this order on the titanium adhesion layer. Although the thickness of the first electrode 10 is varied from the thickness in this state by firing described below or any other operation, the thickness is adjusted in this step of sputtering so that the final thickness can be in the range of 10 nm to 200 nm.

Next, a first orientation control layer 15 is formed. The composition of the first orientation control layer 15 will be changed by firing the first piezoelectric layer 20 or the second piezoelectric layer 40. In this step, a 4 nm-thick titanium layer is formed as a precursor of the first orientation control layer 15. The titanium layer may be formed by, for example, sputtering. As described above, the thickness of the titanium layer may be adjusted so that the final first orientation control layer 15 can have a thickness in the range of 1.0 nm to 50.0 nm.

Subsequently, a first piezoelectric layer 20 is formed on the titanium layer by a liquid-phase process. A precursor solution that is a sol having, for example, a composition: lead/zirconium/titanium=120/52/48 is applied onto the titanium layer by spin coating or the like to form a precursor layer (application step). The precursor layer is heated at a temperature of 130° C. to 250° C. for a certain period for drying (drying step), and the dried precursor layer is further heated to a temperature of 300° C. to 450° C. and kept at this temperature for a certain period for degreasing (degreasing step). The degreased precursor layer is further heated at a temperature of 650° C. to 800° C. and kept at this temperature for a certain period for crystallization (firing step). Thus, the first piezoelectric layer 20 is formed over the first electrode 10. Also, the first orientation control layer 15 is completed through the steps described above.

Subsequently, the first piezoelectric layer 20, the first orientation control layer 15, and the first electrode 10 are subjected to patterning so that the patterned first electrodes 10 can act as discrete electrodes for respective piezoelectric elements 100. The patterning may be performed by, for example, ion milling. Thus, the first piezoelectric layer 20, the first orientation control layer 15, and the first electrode 10, each in a predetermined shape, are completed as shown in FIG. 1.

Next, a second orientation control layer 30 is formed. The composition of the second orientation control layer 30 will be changed by firing the second piezoelectric layer 40. In this step, a titanium layer is formed as a precursor of the second orientation control layer 30. The titanium layer may be formed by, for example, sputtering. The thickness of the titanium layer is, for example, in the range of 1.0 nm to 5.0 nm and, as described above, it may be adjusted so that the final second orientation control layer 30 can have a thickness in the range of 5.0 nm to 22.0 nm.

Subsequently, a second piezoelectric layer 40 is formed on the titanium layer by a liquid-phase process. A precursor solution that is a sol having a composition: lead/zirconium/titanium=120/52/48 is applied onto the titanium layer by spin coating to form a precursor layer (application step). The precursor layer is heated at a temperature of 130° C. to 250° C. for a certain period for drying (drying step), and the dried precursor layer is further heated to a temperature of 300° C. to 450° C. and kept at this temperature for a certain period for degreasing (degreasing step). The degreased precursor layer is further heated at a temperature of 650° C. to 800° C. and kept at this temperature for a certain period for crystallization (firing step). The composition of the titanium layer is changed by the firing operation, and thus the final second orientation control layer 30 has a predetermined composition. In the embodiment shown in FIG. 1, a series of steps from application to firing is repeated two times (performed three times), thus forming the second piezoelectric layer 40 defined by three layers. Thus, the second orientation control layer 30 is completed, and the second piezoelectric layer 40 is formed on the second orientation control layer 30.

For the drying, degreasing and firing steps for forming the first piezoelectric layer 20 and the second piezoelectric layer 40, a rapid thermal annealing (RTA) apparatus using an infrared lamp may be used as a heating apparatus.

Next, a second electrode 50 is formed on the second piezoelectric layer 40. For forming the second electrode 50, a first layer 51 is first formed. Then, after the first layer 51, the second piezoelectric layer 40, and the second orientation control layer 30 are subjected to patterning, a second layer 52 is formed.

For forming the first layer 51, for example, a 5 nm-thick iridium layer and a 4 nm-thick titanium layer are formed in this order on the second piezoelectric layer 40 by sputtering. In this state, heat treatment (recovery annealing) may be performed, if necessary, to repair defects in the piezoelectric layer caused by sputtering. The recovery annealing may be performed at a temperature of, for example, 650° C. to 800° C.

After the formation of the first layer 51, the first layer 51, the second piezoelectric layer 40, and the second orientation control layer 30 are subjected to patterning at one time by, for example, ion milling. In this step, recesses 40a are formed in the second piezoelectric layer 40, so that the substrate 2 (zirconium layer), the side surface of the second orientation control layer 30, the side surface of the second piezoelectric layer 40, and the first layer 51 are exposed in each recess.

Then, a second layer 52 is formed by, for example, forming a 15 nm-thick iridium layer and a 20 nm-thick titanium layer in this order on the first layer 51 by sputtering. Thus, the second electrode 50 is completed as a common electrode.

Through the above steps, the piezoelectric element 100 is completed. If the substrate 2 is a vibration plate 230 or if the substrate 2 is worked into a vibration plate 230, an actuator 110 may be produced by an additional step performed on the substrate 2 or the vibration plate 230. Although in the method described above, the piezoelectric layers are formed by a liquid-phase process, the piezoelectric layers may be formed by, for example, CVD, sputtering, or any other method without particular limitation.

3. Liquid Ejection Head

Figure 3:
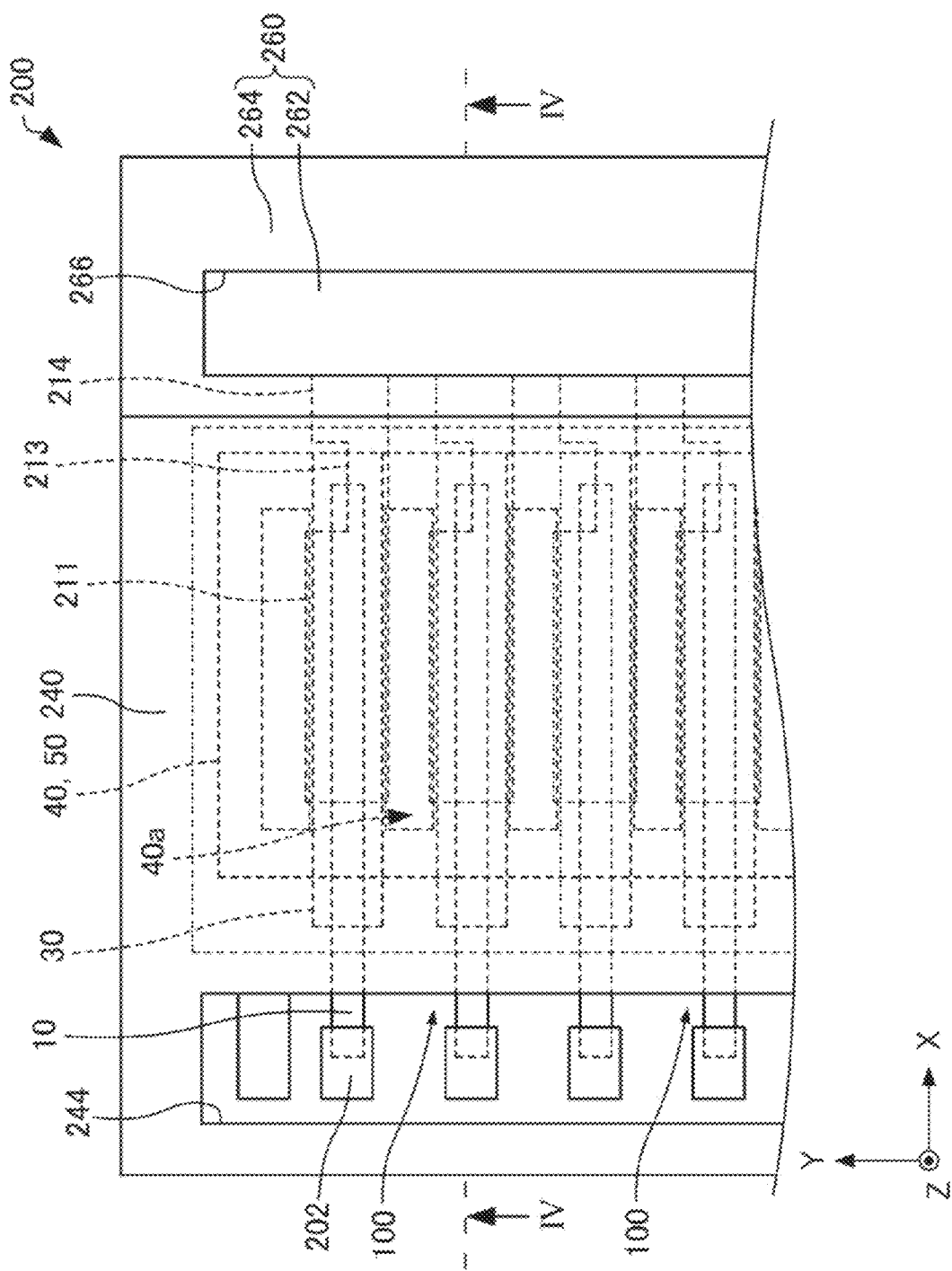
FIG. 3 is a schematic plan view of a liquid ejection head according to an embodiment of the invention.
Figure 4:
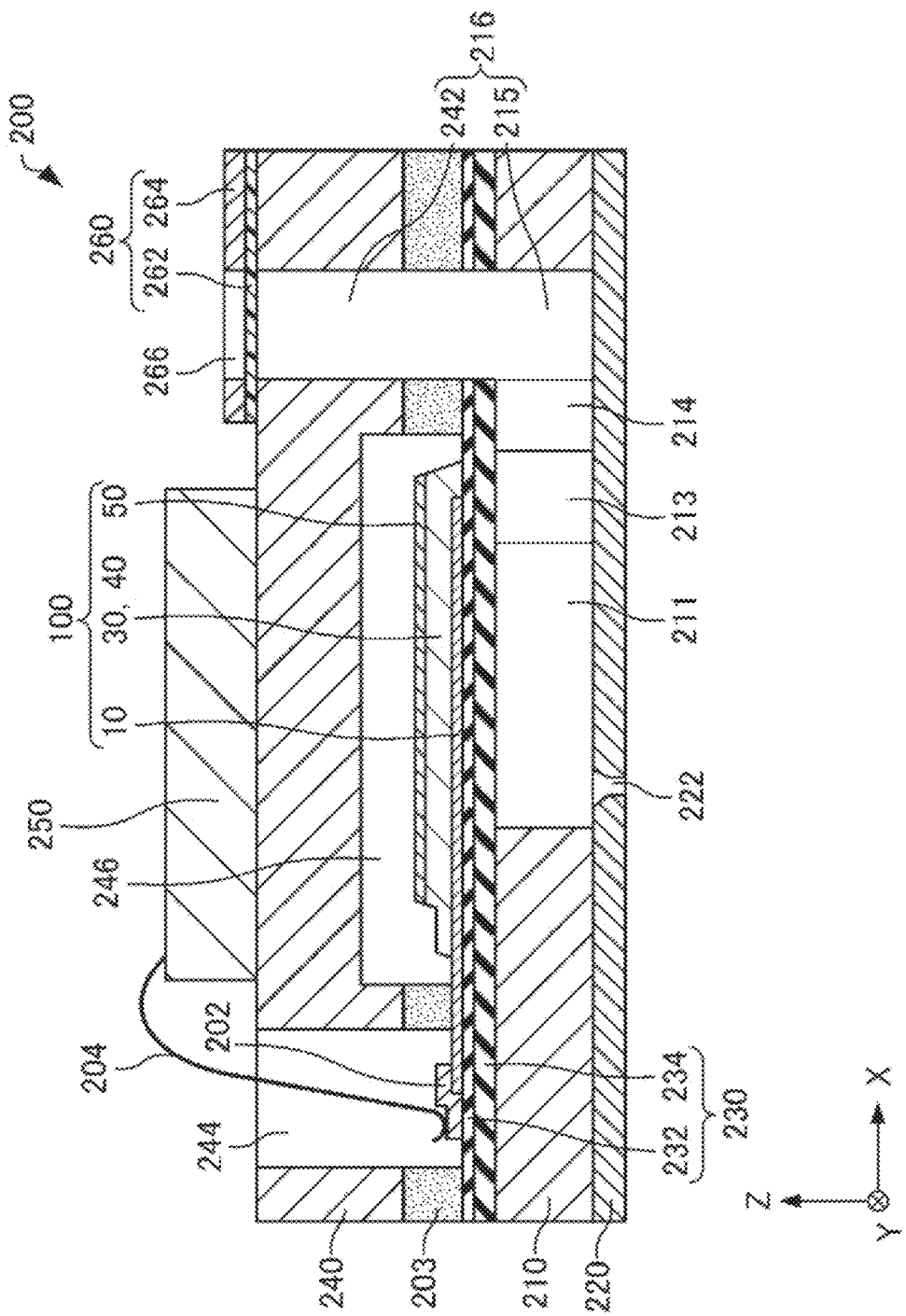
FIG. 4 is a schematic sectional view of the liquid ejection head shown in FIG. 3, taken along line IV-IV.

A liquid ejection head according to an embodiment of the invention will now be described with reference to some drawings. FIG. 2 is a schematic exploded perspective view of a liquid ejection head 200 according to an embodiment of the invention. FIG. 3 is a schematic plan view of the liquid ejection head 200 of the embodiment. FIG. 4 is a schematic sectional view of the liquid ejection head 200 of the embodiment taken along line IV-IV in FIG. 3. In FIGS. 2 to 4, three directions perpendicular to each other are represented by using an X, a Y, and a Z axis.

The liquid ejection head according to the present disclosure includes the above-described piezoelectric elements 100 or the actuator 110. In the following description, a liquid ejection head 200 including the piezoelectric elements 100 will be described by way of example.

As shown in FIGS. 2 to 4, the liquid ejection head 200 includes the piezoelectric elements 100, a flow channel substrate 210, a nozzle plate 220, a vibration plate 230, a protective substrate 240, a circuit board 250, and a compliance substrate 260. In FIG. 3, the circuit board 250 and connection wiring liens 204 are omitted for convenience sake.

The flow channel substrate 210 may be, for example, a silicon substrate. The flow channel substrate 210 has a plurality of pressure generating chambers 211. The pressure generating chambers 211 are separated by a plurality of partitions 212.

The flow channel substrate 210 has ink supply ports 213 and communication paths 214 at the end of each pressure generating chamber 211 in the +X axis direction. Each ink supply port 213 narrows the corresponding pressure generating chamber 211 in the Y axis direction at the end of the chamber in the +X axis direction to reduce the sectional area of the opening of the chamber. The dimension in the Y axis direction of each communication path 214 is, for example, equal to the dimension in the Y axis direction of the pressure generating chamber 211. A communicating section 215 is formed adjacent to the communication paths 214 in the +X axis direction. The communicating section 215 defines a part of a manifold 216. The manifold 216 acts as a common ink chamber shared by the pressure generating chambers 211. Thus, the flow channel substrate 210 has therein the liquid flow channels including the pressure generating chambers 211, the ink supply channels 213, the communication paths 214, and the communicating section 215.

The nozzle plate 220 is disposed on one side (adjacent to the surface in the −Z axis direction) of the flow channel substrate 210. The nozzle plate 220 may be made of, for example, SUS (steel use stainless). The nozzle plate 220 may be bonded to the flow channel substrate 210 with, for example, an adhesive, a thermal fusion film, or the like. Nozzle openings 222 are aligned in the Y axis direction in the nozzle plate 220. The nozzle openings 222 communicate with the corresponding pressure generating chambers 211.

The vibration plate 230 is disposed on one side (adjacent to the surface in the +Z axis direction) of the flow channel substrate 210. The vibration plate 230 may include, for example, a first insulating layer 232 disposed on the flow channel substrate 210 and a second insulating layer 234 disposed on the first insulating layer 232. The first insulating layer 232 may be made of, for example, silicon oxide. The second insulating layer 234 may be made of, for example, zirconium oxide.

The piezoelectric elements 100 may be arranged, for example, on the vibration plate 230. The number of the piezoelectric elements 100 are not particularly limited provided that it is plural. In the embodiment shown in FIG. 2, the piezoelectric elements share the second electrode 50 as a common electrode.

In the liquid ejection head 200, the vibration plate 230 and the first electrodes 10 are displaced by a deformation of the piezoelectric elements 100 capable of electromechanical conversion. In other words, the vibration plate 230 and the first electrodes 10 effectively act as a vibration plate in the present embodiment. In an embodiment, only the first electrodes 10 may act as the vibration plate without using the vibration plate 230. If the first electrodes 10 are disposed directly on the flow channel substrate 210, it is beneficial that the first electrodes 10 are protected by a protective film or the like to avoid coming into contact with liquid.

The first electrodes 10 are discrete electrodes each provided independently for each pressure generating chamber 211. The dimension in the Y axis direction of the first electrode 10 is smaller than the dimension in the Y axis direction of the pressure generating chamber 211. The dimension in the X axis direction of the first electrode 10 is larger than the dimension in the X axis direction of the pressure generating chamber 211. Both ends in the X axis direction of the first electrode 10 are located outside the pressure generating chamber 211. The end of the first electrode 10 on the −X axis direction side is connected to a leading electrode 202.

The first electrode 10, the first piezoelectric layer 20, the second orientation control layer 30, the second piezoelectric layer 40, and the recess 40a may have any dimensions and any shape, provided that the active portion 101 of the piezoelectric element is located within the pressure generating chamber 211 when viewed from above (see FIG. 3).

The second electrode 50 is a continuous layer disposed over the second piezoelectric layers 40 and the vibration plate 230. The second electrode 50 is a common electrode shared by the plurality of piezoelectric elements 100. In the embodiment shown in the drawings, the second electrode 50 has recesses 40a formed by patterning for forming the second piezoelectric layers 40. The recesses 40a may be aligned with the pressure generating chambers 211 when viewed from above from the viewpoint of allowing the vibration plate 230 to bend or warp largely.

The protective substrate 240 is bonded to the flow channel substrate 210 with an adhesive 203. The protective substrate 240 has a through hole 242 therein. In the embodiment shown in the drawings, the through hole 242 passes through the protective substrate 240 in the Z axis direction, thus communicating with the communication section 215. The through hole 242 and the communication section 215 define a manifold 216 that will act as a common ink chamber shared by the pressure generating chambers 211. The protective substrate 240 also has another through hole 244 passing through the protective substrate 240 in the Z axis direction. One end of each leading electrode 202 is located in the through hole 244.

Furthermore, the protective substrate 240 has an opening 246 therein. The opening 246 is a space that allows the piezoelectric elements 100 to operate without interference. The opening 246 may be or may not be sealed.

The circuit board 250 is disposed on the protective substrate 240. The circuit board 250 includes a semiconductor integrated circuit (IC) operable to drive the piezoelectric elements 100. The circuit board 250 and the leading electrodes 202 are electrically connected to each other by connection wiring lines 204.

The compliance substrate 260 is disposed on the protective substrate 240. The compliance substrate 260 includes a sealing layer 262 disposed on the protective substrate 240 and a fixing plate 264 disposed on the sealing layer 262. The sealing layer 262 seals the manifold 216. The sealing layer 262 may be flexible. The fixing plate 264 has a through hole 266 therein. The through hole 266 passes through the fixing plate 264 in the Z axis direction. The through hole 266 is aligned with the manifold 216 when viewed from above (in the Z axis direction).

Since the liquid ejection head 200 includes the above-described piezoelectric elements 100, the applied voltage is efficiently used for large displacement of the vibration plate 230 so that liquid can be efficiently ejected. Also, since the polarized domains of the crystals in the piezoelectric layer are small, pining is not likely to occur.

Accordingly, a bias of displacement caused by polarization is reduced, and, for example, changes in volume of the pressure generating chambers 211 can be increased. Consequently, the liquid ejection head 200 can efficiently eject liquid.

4. Examples and Referential Examples

The above-described embodiments of the invention will now be further described in detail with reference to Examples. However, the invention is not limited to the disclosed Examples.

First, a substrate 2 was prepared. More specifically, a {110} silicon substrate was oxidized by heating to yield a 520 nm-thick silicon oxide layer. Subsequently, a zirconium layer was deposited on the silicon oxide layer by sputtering, and the zirconium layer was oxidized by heating to yield a 200 nm-thick zirconium oxide layer. Thus, the substrate 2 was prepared through those steps.

Next, a 20 nm-thick titanium layer was formed as an adhesion layer on the substrate 2, and a first electrode 10 was formed by forming a 50 nm-thick platinum layer and a 5 nm-thick iridium layer in this order on the titanium adhesion layer.

Subsequently, a 4 nm-thick titanium layer was formed on the first electrode 10. The titanium layer was then subjected to the following operation, thereby changed into a first orientation control layer 15.

After the formation of the titanium layer, a first piezoelectric layer 20 was formed on the titanium layer by a liquid-phase process. More specifically, a precursor solution that was a sol having a composition: lead/zirconium/titanium=120/52/48 was applied onto the titanium layer by spin coating or the like to form a precursor layer (application step). The precursor layer was heated at a temperature of 130° C. to 250° C. for a certain period for drying (drying step), and the dried precursor layer was further heated to a temperature of 300° C. to 450° C. and kept at this temperature for a certain period for degreasing (degreasing step). The degreased precursor layer was further heated at a temperature of 650° C. to 800° C. and kept at this temperature for a certain period for crystallization (firing step). Thus, the first orientation control layer 15 and the first piezoelectric layer 20 were formed over the first electrode 10.

Subsequently, the first piezoelectric layer 20, the first orientation control layer 15, and the first electrode 10 were subjected to patterning so that the patterned first electrodes 10 would act as discrete electrodes for respective piezoelectric elements 100. The patterning was performed by ion milling. Thus, the first piezoelectric layer 20, the first orientation control layer 15, and the first electrode 10, each in a predetermined shape, were completed as shown in FIG. 1.

Next, a second orientation control layer 30 was formed. The composition of the second orientation control layer 30 is changed by firing the second piezoelectric layer 40. In the present example, a titanium layer was formed as a precursor of the second orientation control layer 30. The titanium layer was formed by sputtering. The thickness of the titanium layer and the conditions for forming the titanium layer in each Example were as follows.

Titanium Layer Forming Conditions

For each Example, titanium layer thickness (nm), argon flow rate (sccm), and sputtering power (W) are shown in this order.
Example 1: 1.5, 40, 100
Example 2: 2.0, 40, 100
Example 3: 2.5, 40, 100
Example 4: 4.0, 40, 100
Referential Example 1: 0.0, 40, 100

Next, a second piezoelectric layer 40 was formed on the titanium layer by a liquid-phase process. More specifically, a precursor solution that was a sol having a composition: lead/zirconium/titanium=120/52/48 was applied onto the titanium layer by spin coating to form a precursor layer (application step). The precursor layer was heated at a temperature of 130° C. to 250° C. for a certain period for drying (drying step), and the dried precursor layer was further heated to a temperature of 300° C. to 450° C. and kept at this temperature for a certain period for degreasing (degreasing step). The degreased precursor layer was further heated at a temperature of 650° C. to 800° C. and kept at this temperature for a certain period for crystallization (firing step). The composition of the titanium layer is changed by the firing operation, and thus the final second orientation control layer 30 has a predetermined composition. A series of the steps from the application to the firing was repeated two times so that the resulting piezoelectric body including the first piezoelectric layer 20 would have four layers, and thus, the second piezoelectric layer 40 was formed so that the total thickness of the first orientation control layer 15, the first piezoelectric layer 20, the second orientation control layer 30, and the second piezoelectric layer 40 would be 760 nm.

For forming the second electrode 50, a first layer 51 was first formed. Then, after the first layer 51, the second piezoelectric layer 40, and the second orientation control layer 30 were subjected to patterning, a second layer 52 was formed. More specifically, a 5 nm-thick iridium layer and a 4 nm-thick titanium layer were formed in this order on the second piezoelectric layer 40 by sputtering, thus forming a first layer 51. Subsequently, recovery annealing was performed under the conditions shown below. Then, the first layer 51, the second piezoelectric layer 40, and the second orientation control layer 30 are simultaneously subjected to patterning by ion milling.

Then, a second layer 52 was formed by forming a 15 nm-thick iridium layer and a 20 nm-thick titanium layer in this order on the first layer 51 by sputtering. Thus, the second electrode 50 was completed.

The conditions for recovery annealing after the formation of the first layer 51 of the second electrode 50 and variations of piezoelectric displacement are shown below. For the piezoelectric displacement, silicon of the substrate of each sample was removed by etching using KOH, and then, piezoelectric displacement being the displacement of the vibration plate was measured with a laser Doppler vibrometer Conditions for Recovery Annealing After Formation of First Layer of Second Electrode and Piezoelectric Displacement The sample of Example 2 was subjected to annealing as Example 5 and Referential Example 2. For each Example, annealing temperature (° C.), annealing time (min), and piezoelectric displacement (nm) are shown below in this order.
Example 5: 720, 8, 680
Referential Example 2: 720, 2, 587

Result Consideration

Figure 6:
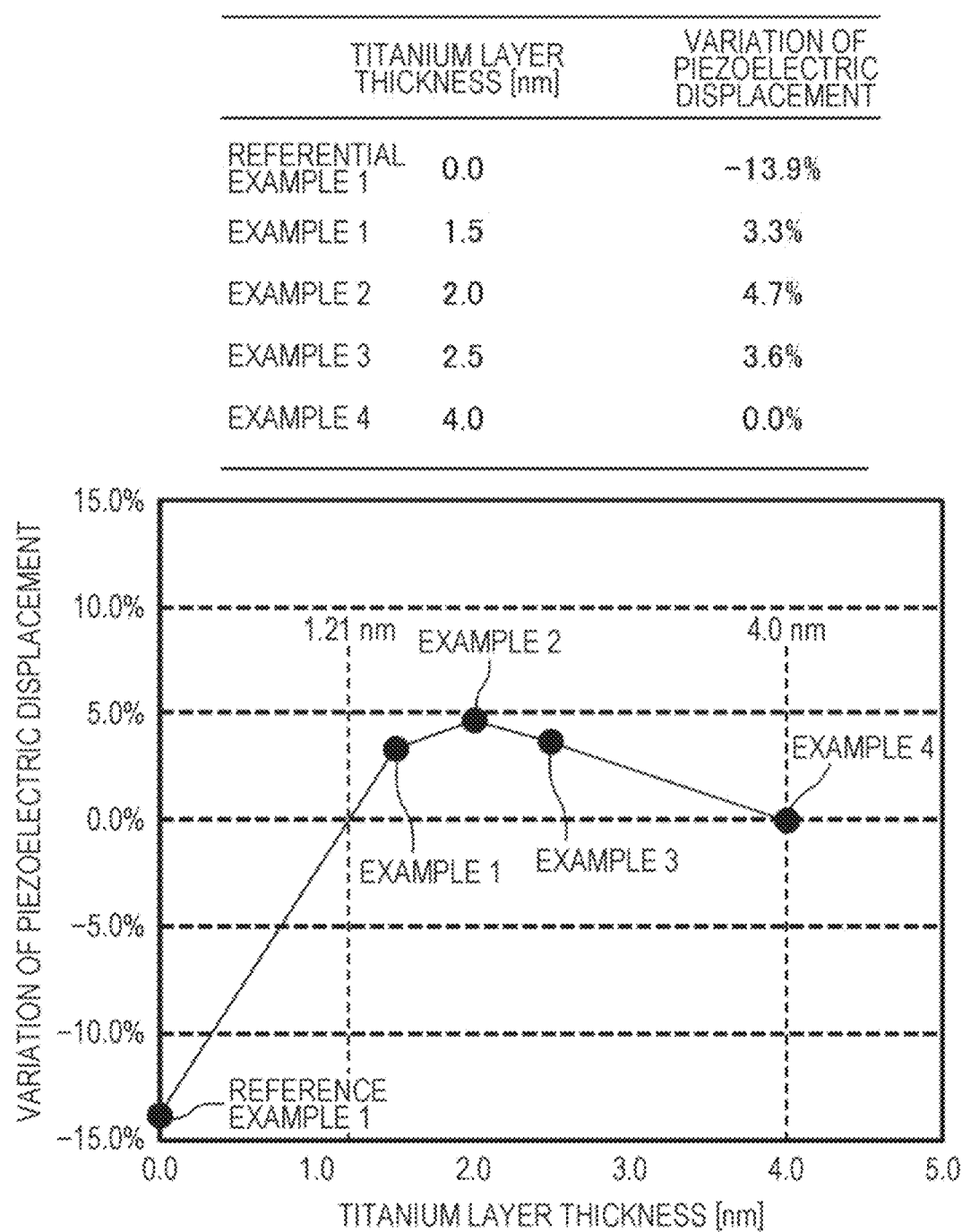
FIG. 6 is a plot depicting the relationship between variation of piezoelectric displacement and titanium layer thickness.

FIG. 6 depicts the relationship between the thickness of the titanium layer that will be changed into the second orientation control layer and variation of piezoelectric displacement (Examples 1 to 4 and Referential Example 1). The variation of piezoelectric displacement with respect to the displacement in Example 4 in which the thickness of the titanium layer was 4 nm increased toward the thinner side and came to a maximum at the thickness of Example 2 that was 2 nm.

In contrast, in the case of Referential Example 1 having no titanium layer (second orientation control layer), the piezoelectric displacement decreased about 14%. These results suggest that there is an optimal thickness of the titanium layer (second orientation control layer) and that the titanium layer contributes to piezoelectric displacement. FIG. 6 also shows that the thickness of the titanium layer at which the variation of piezoelectric displacement was larger than 0 was 1.21 nm.

Figure 7:
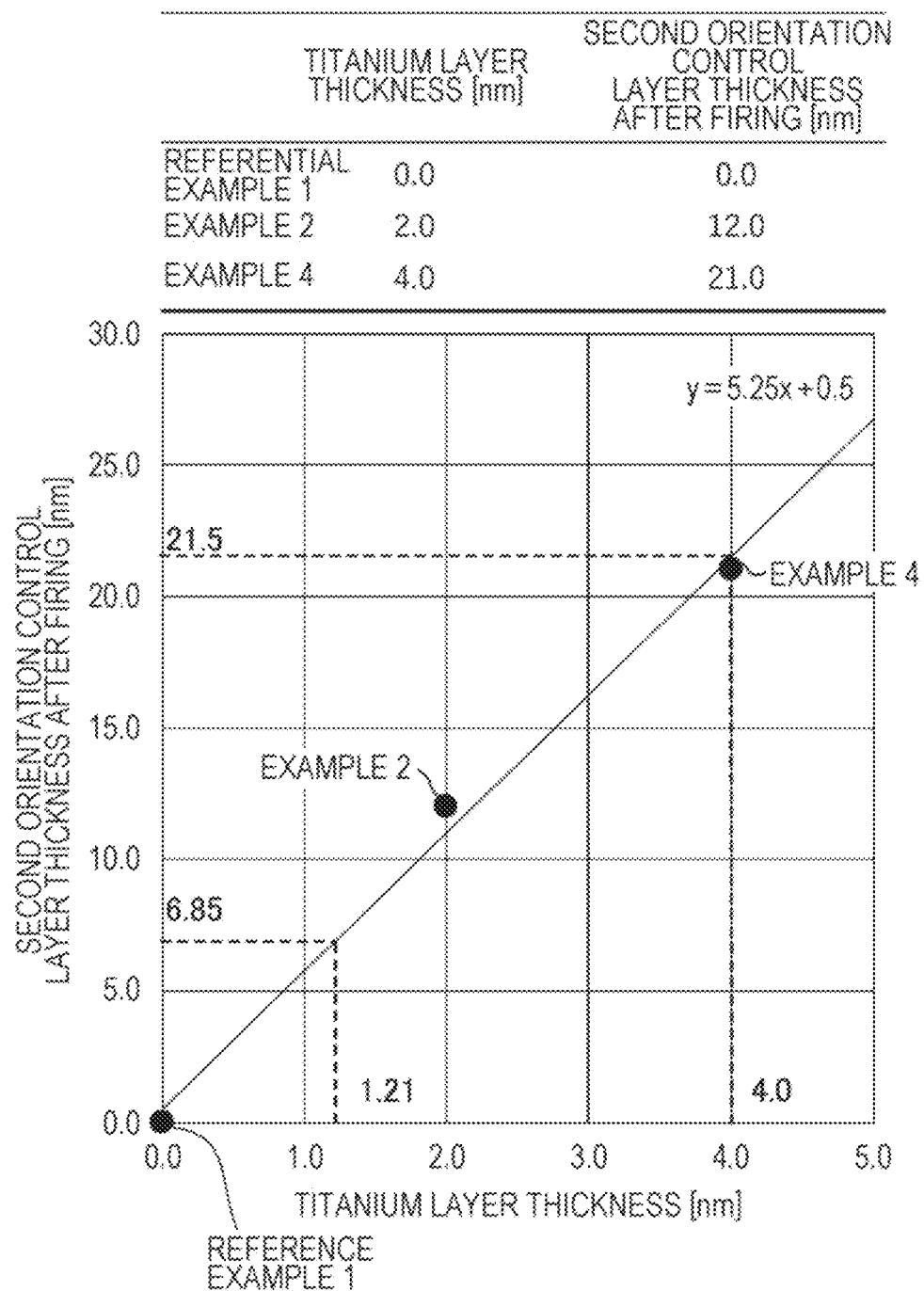
FIG. 7 is a plot depicting the relationship between the thickness of a titanium layer and the thickness of an orientation control layer.

FIG. 7 depicts the relationship between the thickness of the titanium layer and the thickness of the second orientation control layer after firing. As is clear from FIG. 7, the thickness of the titanium layer and the thickness of the second orientation control layer after firing are substantially proportionate to each other, drawing an approximate straight line. The approximate straight line is expressed by y=5.25x+ 0.5, wherein y represents the vertical axis and x represents the horizontal axis.

From the approximate straight line in FIG. 7, the thickness of the second orientation control layer corresponding to the thickness of 1.21 nm of the titanium layer is 6.85 nm. Also, the thickness of the second orientation control layer corresponding to the thickness of 4.0 nm of the titanium layer is 21.5 nm.

Figure 8:
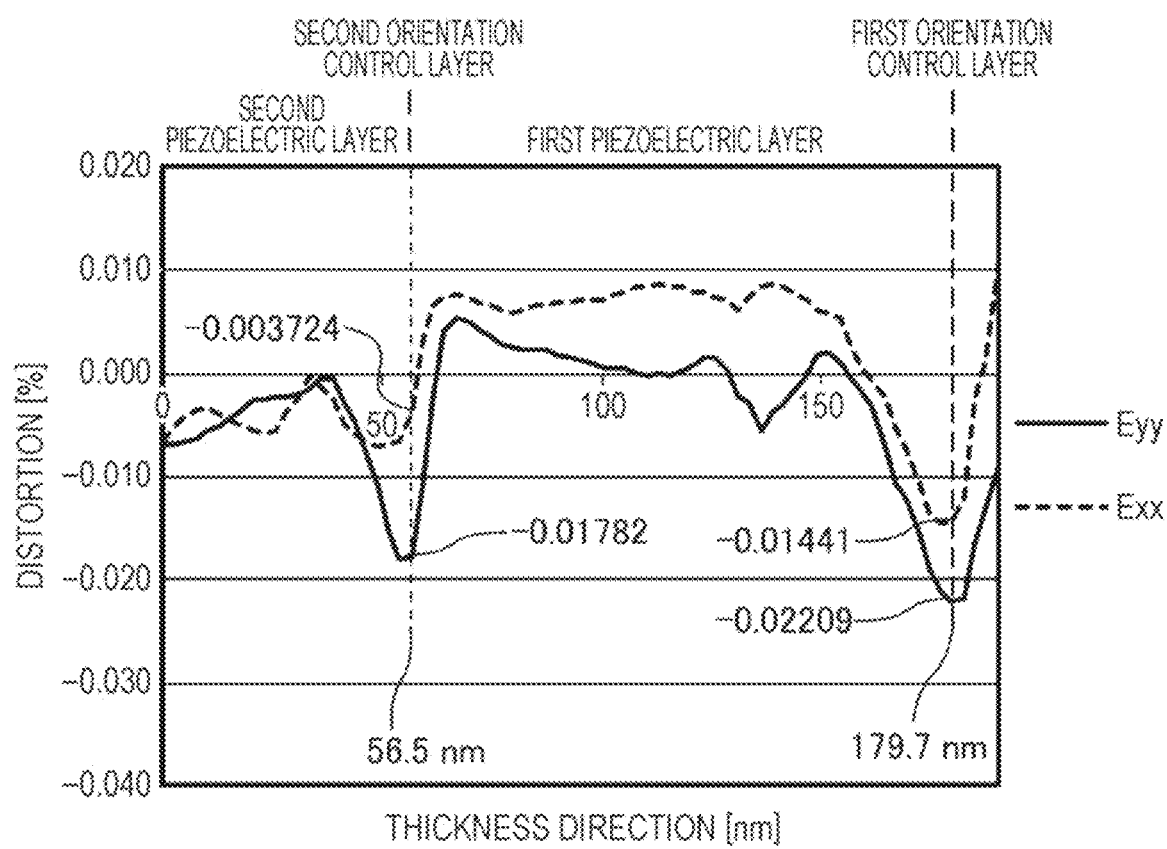
FIG. 8 is a plot depicting the profile of the crystal distortion in the a-axis direction ((a-axis length/a-axis length of a referential diffraction pattern)—1: εxx) of a sample of Example 5 including a first electrode, a first orientation control layer, a first piezoelectric layer, a second orientation control layer, and a second piezoelectric layer and the profile of the crystal distortion in the c-axis direction ((c-axis length/c-axis length of the referential diffraction pattern)—1: εyy) of the sample.
Figure 10:
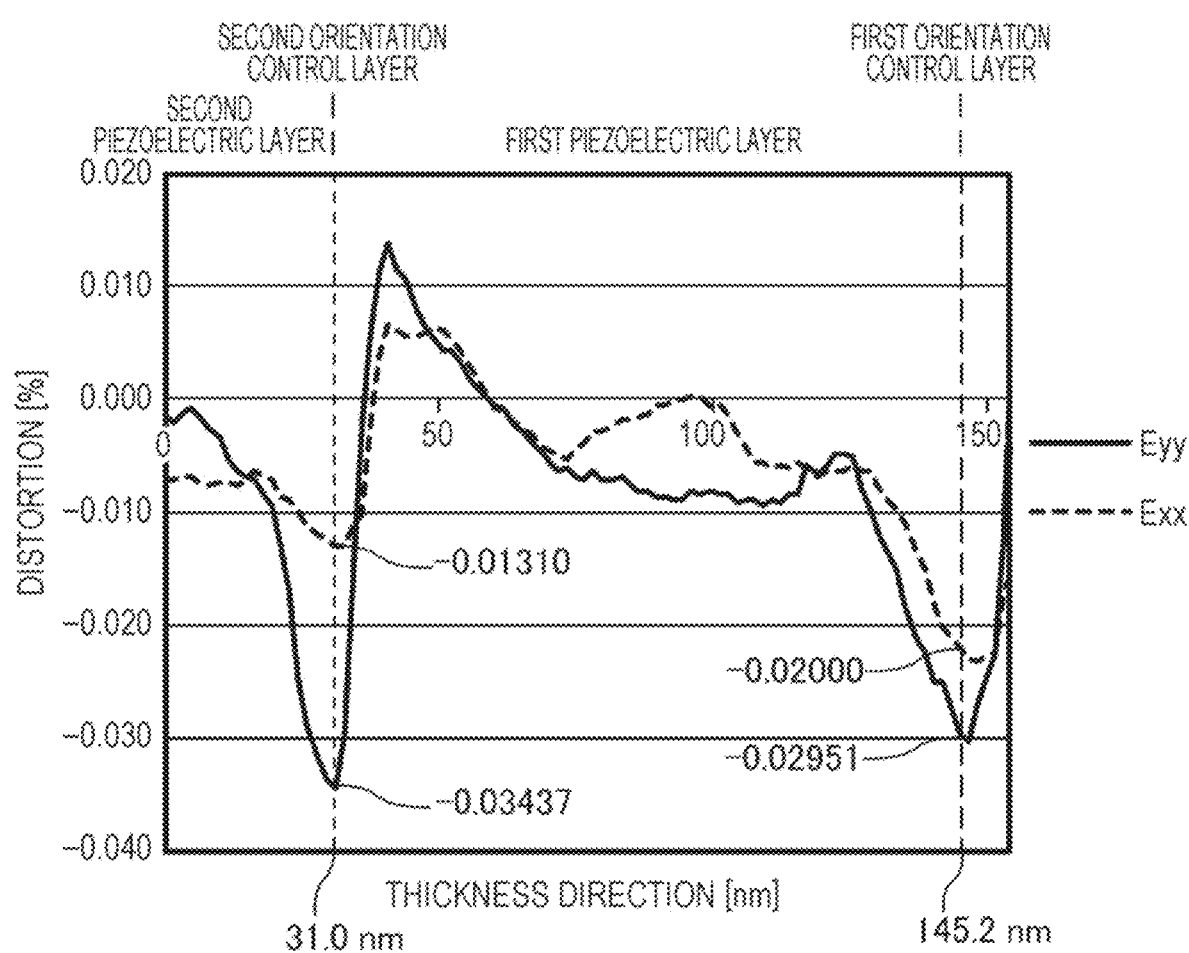
FIG. 10 is a plot depicting the profile of the crystal distortion in the a-axis direction ((a-axis length/a-axis length of a referential diffraction pattern)—1: εxx) of a sample of Referential Example 2 including a first electrode, a first orientation control layer, a first piezoelectric layer, a second orientation control layer, and a second piezoelectric layer and the profile of the crystal distortion in the c-axis direction ((c-axis length/c-axis length of the referential diffraction pattern)—1: εyy) of the sample.

FIGS. 8 and 10 are plots depicting the profile of the crystal distortion in the a-axis direction ((a-axis length/a-axis length of a reference diffraction pattern)—1: εxx) of samples of Example 5 and Referential Example 2, respectively, including the first electrode, the first orientation control layer, the first piezoelectric layer, the second orientation control layer, and the second piezoelectric layer and the profile of the crystal distortion in the c-axis direction ((c-axis length/c-axis length of the reference diffraction pattern)—1: εyy) of the respective samples.

Figure 9:
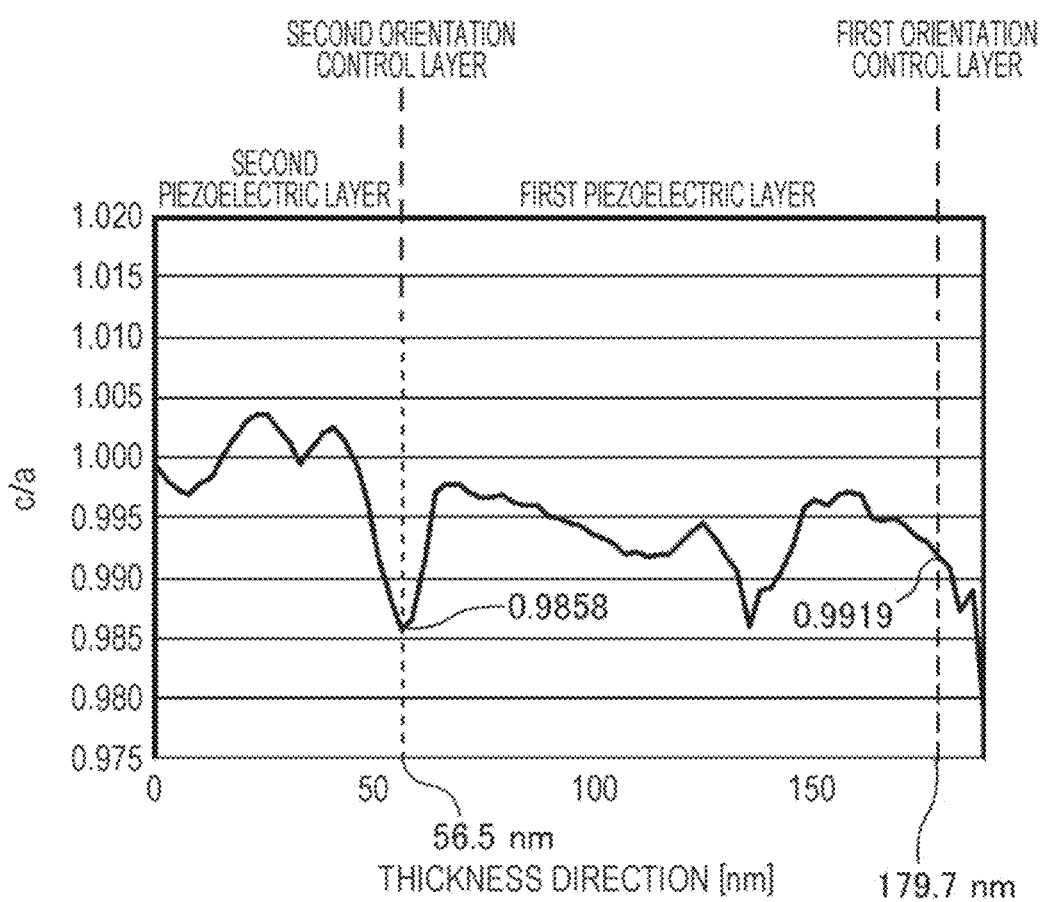
FIG. 9 is a plot depicting the profile of crystal distortion (c/a) of the sample of Example 5 including the first electrode, the first orientation control layer, the first piezoelectric layer, the second orientation control layer, and the second piezoelectric layer.
Figure 11:
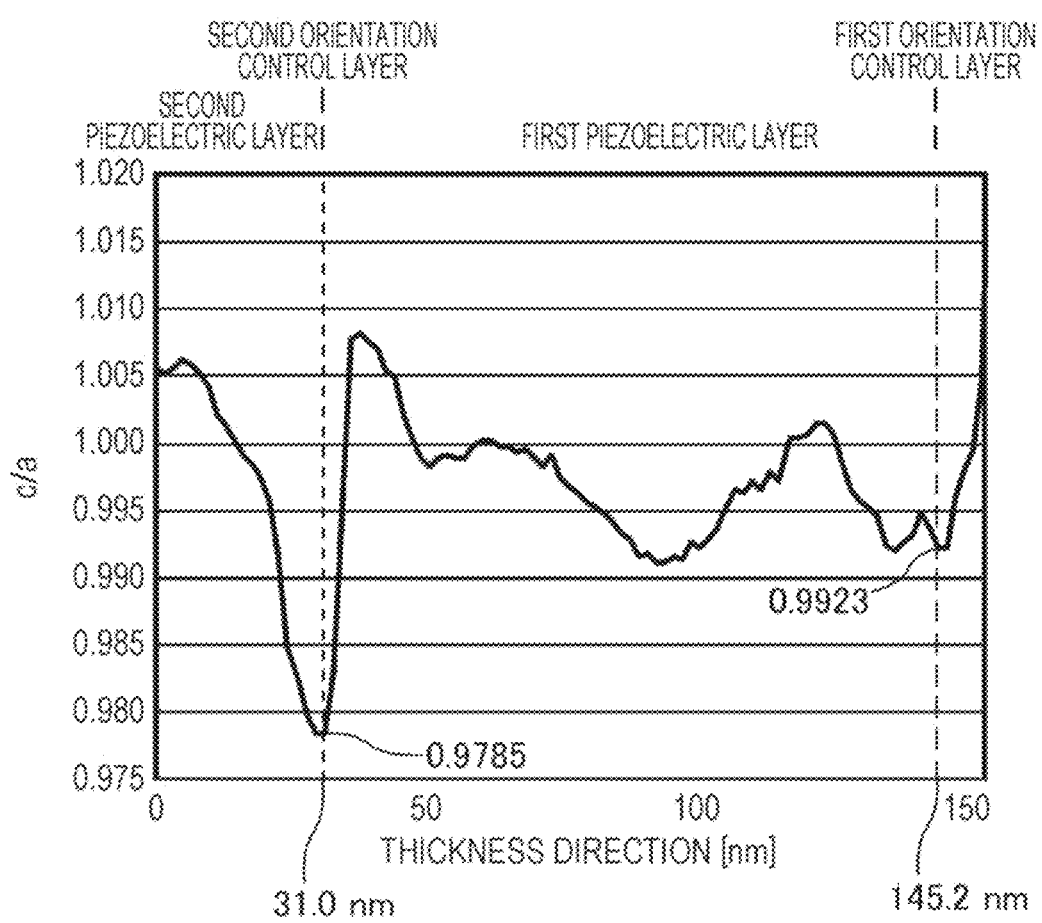
FIG. 11 is a plot depicting the profile of crystal distortion (c/a) of the sample of Referential Example 2 including the first electrode, the first orientation control layer, the first piezoelectric layer, the second orientation control layer, and the second piezoelectric layer.

FIGS. 9 and 11 are plots depicting the profile of crystal distortion (c/a) of the samples of Example 5 and Referential Example 2, respectively, including the first electrode, the first orientation control layer, the first piezoelectric layer, the second orientation control layer, and the second piezoelectric layer. For obtaining profiles, a substantially parallel electron beam of about 3 nm in diameter was emitted to impinge on a randomly selected (columnar) crystal grain in the second piezoelectric layer on the first electrode in the <100> pc direction (μμDIFF mode, Cs corrector: OFF), and a thus obtained electron diffraction pattern (nano-beam diffraction (NBD) pattern) was synchronized with scan lines to yield a 4D-STEM image (150 nm in width×300 nm in height) four-dimensionally distributed in a real space and an inverse space. For such an analysis, an atomic resolution analytical electron microscope JEM-ARM200F (accelerating voltage: 200 kV, manufactured by JEOL) and a camera system ONE-VIEW STEMx system (manufactured by GATAN) were used.

The results of Example 5 shown in FIG. 9 and the results of Referential Example 2 shown in FIG. 11 suggest that a large piezoelectric displacement can be produced by aligning the polarization axes in the second orientation control layer, which has a low dielectric constant, parallel to the surface of the first electrode. In addition, FIGS. 9 and 11 suggest that when c/a (ratio of c to a) satisfies 0.980≤c/a<1 (lattice has such a distorsion as to lengthen in plane of the first electrode), piezoelectric displacement increases, and that when 0.985≤c/a<1 holds true, piezoelectric displacement increases with reliability.

The results of analysis show that the composition of the second orientation control layer was changed into titanium-rich lead zirconate titanate (PZT) by a thermal diffusion reaction with the overlying second piezoelectric layer and the thickness thereof increased to about 10 nm (when the titanium layer was formed to a thickness of 2 nm). The titanium-rich lead zirconate titanate layer, which has a tetragonal nano-domain structure, contributes to 90° domain rotation.

Figure 12:
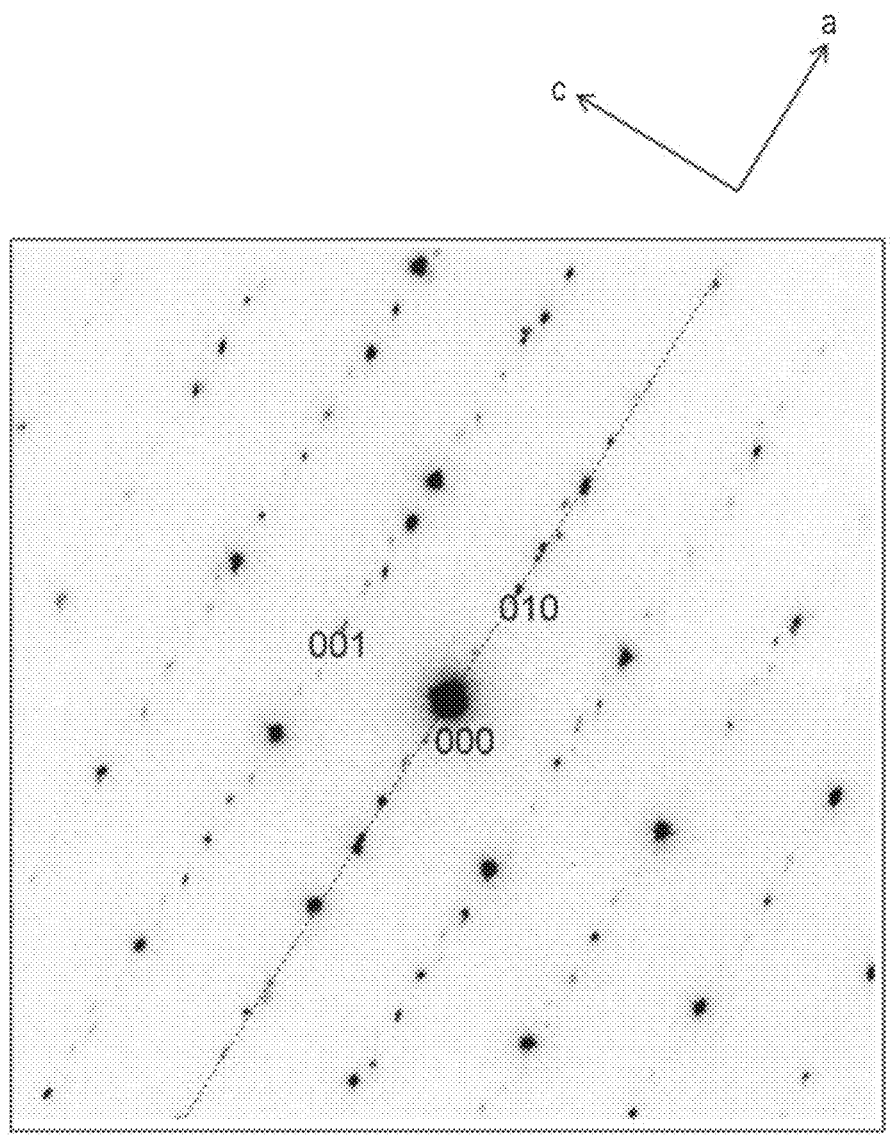
FIG. 12 is an electron diffraction pattern of PZT crystals in an area of 3 nm in diameter of the sample of Example 5.
Figure 13:
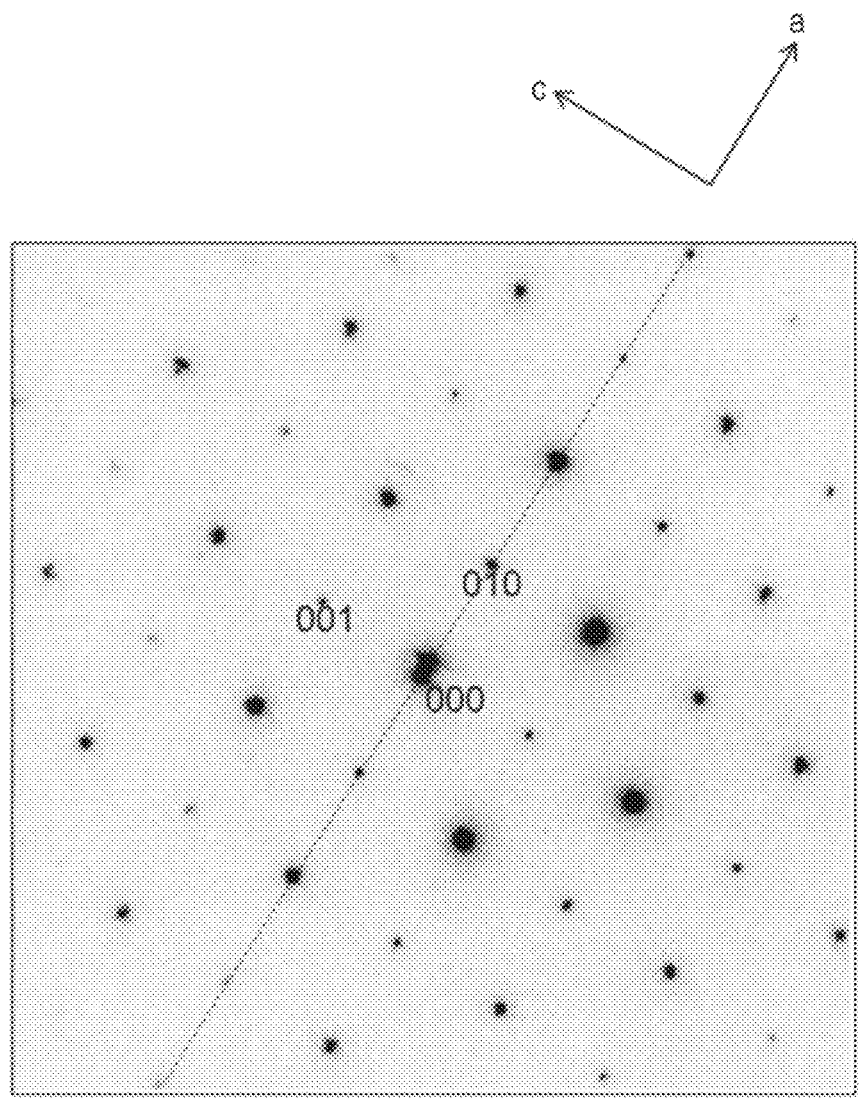
FIG. 13 is an electron diffraction pattern of PZT crystals in an area of 3 nm in diameter of the sample of Referential Example 2.

FIGS. 12 and 13 depict section STEM-NBD (nano-beam diffraction) patterns of the first piezoelectric layer (PZT) of Example 5 and Referential Example 2, respectively. For such an analysis, an atomic resolution analytical electron microscope JEM-ARM200F (accelerating voltage: 200 kV, manufactured by JEOL) and a camera system ONE-VIEW STEMx system (manufactured by GATAN) were used. The electron beam impinges in the <100> pc direction. In Example 5 (FIG. 12) exhibited a large piezoelectric displacement, when the crystal grains in the sample were carefully observed every area of 3 nm in diameter, a plurality of diffraction spots successively aligned in the a-axis direction were observed. This suggests that the piezoelectric layer contained densely arranged stacking defects. In other words, domains in an area of 3 nm or less in diameter are subdivided by stacking defects, and thus the piezoelectric layer contains polarized domains of less than 3.0 nm in diameter. Since domains are subdivided by stacking defects, the response to electric field is improved. This is probably the reason for enabling domain rotation in a low electric field. On the other hand, in Referential Example 2 (FIG. 13), successively aligned diffraction spots were hardly observed. Thus, in Example 5, the structure of the piezoelectric layer was converted into a fine domain structure having good response to electric field. This is the reason why the piezoelectric layer exhibited a large piezoelectric displacement.

In the description of the present disclosure, the expression "a specific member B (herein after referred to as B) disposed over or under a specific member A (hereinafter referred to as A)" includes the case where B is disposed directly on or directly under A and the case where B is disposed on or under A with another member therebetween. The same applied to the expression "on A" as with "over A". Also, the expression "B is present over or under A" is independent of the direction of gravity and implies that A and B can be in such a positional relationship by varying the direction in or the angle with which the object is viewed.

The invention is not limited to the above-described embodiments, and various modifications may be made. For example, the invention includes substantially the same form as the disclosed embodiments (for example, a form including the same function and method and producing the same result, or a form having the same purpose and producing the same effect). Some elements unessential to the form of the disclosed embodiment may be replaced. The form of an embodiment of the invention includes an element producing the same effect or achieving the same object, as the form of the disclosed embodiments. The forms of the disclosed embodiments may be combined with the known art.

What is claimed is:

1. A piezoelectric element comprising:
   a first electrode disposed over a substrate;
   an orientation control layer disposed over the first electrode, the orientation control layer containing titanium;
   a piezoelectric layer disposed over the orientation control layer, the piezoelectric layer having a perovskite crystal structure;
   an additional piezoelectric layer between the first electrode and the orientation control layer, the additional piezoelectric layer having a perovskite crystal structure; and
   a second electrode disposed over the piezoelectric layer, wherein the orientation control layer has a thickness in the range of 5.0 nm to 22.0 nm.

2. The piezoelectric element according to claim 1, wherein the orientation control layer has a thickness in the range of 6.85 nm to 21.5 nm.

3. A liquid ejection head comprising the piezoelectric element as set claim 2.

4. The piezoelectric element according to claim 1, wherein the total thickness of the piezoelectric layer, the orientation control layer, and the additional piezoelectric layer is 1.0 μm or less.

5. A liquid ejection head comprising the piezoelectric element as set claim 4.

6. The piezoelectric element according to claim 1, wherein the first electrode has a thickness in the range of 50 nm to 140 nm.

7. A liquid ejection head comprising the piezoelectric element as set claim 6.

8. The piezoelectric element according to claim 1, wherein the orientation control layer contains lead and titanium.

9. A liquid ejection head comprising the piezoelectric element as set claim 8.

10. The piezoelectric element according to claim 1, wherein the second electrode acts as a common electrode shared with another piezoelectric element.

11. A liquid ejection head comprising the piezoelectric element as set claim 10.

12. A liquid ejection head comprising the piezoelectric element as set claim 1.

* * * * *